(12) United States Patent
Lin et al.

(10) Patent No.: US 8,378,378 B2
(45) Date of Patent: Feb. 19, 2013

(54) LIGHT EMITTING DIODE PACKAGE AND METHOD OF FABRICATING THE SAME

(75) Inventors: Shen Bo Lin, Hsinchu County (TW); Chao Hsiung Chang, Hsinchu County (TW); Wen Liang Tseng, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 176 days.

(21) Appl. No.: 12/902,332

(22) Filed: Oct. 12, 2010

(65) Prior Publication Data

US 2011/0089464 A1    Apr. 21, 2011

(30) Foreign Application Priority Data

Oct. 15, 2009   (CN) .......................... 2009 1 0204845

(51) Int. Cl.
*H01L 31/048* (2006.01)

(52) U.S. Cl. ........... 257/99; 257/E33.062; 257/E33.066; 438/26

(58) Field of Classification Search .................... 257/99, 257/692, E33.062, E33.066; 438/26, 28
See application file for complete search history.

(56) References Cited

U.S. PATENT DOCUMENTS

| | | | |
|---|---|---|---|
| 5,346,750 A * | 9/1994 | Hatakeyama et al. | 428/209 |
| 6,531,328 B1 | 3/2003 | Chen | |
| 7,176,623 B2 * | 2/2007 | Nitta et al. | 313/512 |
| 7,518,155 B2 | 4/2009 | Ishidu et al. | |
| 7,815,343 B2 * | 10/2010 | Nii et al. | 362/311.03 |
| 8,013,350 B2 * | 9/2011 | Itoi et al. | 257/98 |
| 8,076,680 B2 | 12/2011 | Lee et al. | |
| 8,093,619 B2 | 1/2012 | Hayashi | |
| 8,097,896 B2 * | 1/2012 | Kim et al. | 257/99 |
| 2003/0006422 A1 * | 1/2003 | Miki et al. | 257/99 |
| 2005/0263873 A1 * | 12/2005 | Shoji | 257/698 |
| 2006/0284207 A1 | 12/2006 | Park et al. | |
| 2009/0001404 A1 | 1/2009 | Ohata | |
| 2009/0121251 A1 * | 5/2009 | Kniajanski et al. | 257/99 |
| 2009/0154513 A1 | 6/2009 | Shin | |
| 2010/0224904 A1 * | 9/2010 | Lee et al. | 257/99 |
| 2010/0314654 A1 * | 12/2010 | Hayashi | 257/99 |
| 2011/0037094 A1 * | 2/2011 | Lin et al. | 257/99 |
| 2012/0168792 A1 * | 7/2012 | Kang et al. | 257/94 |

FOREIGN PATENT DOCUMENTS

| | | |
|---|---|---|
| CN | 1833322 | 9/2006 |
| CN | 101142692 A | 3/2008 |
| CN | 101335318 | 12/2008 |
| JP | 2006-216764 A | 8/2006 |
| KR | 10-2009-0062229 A | 6/2009 |
| WO | 2008/081794 A1 | 7/2008 |

* cited by examiner

*Primary Examiner* — Allan R Wilson
(74) *Attorney, Agent, or Firm* — Altis Law Group, Inc.

(57) ABSTRACT

A light emitting diode package includes a base having a first surface, an electrode portion attached to the base, a pair of inner electrodes disposed on the first surface, a pair of outer electrodes, a pair of conductive pillars, a light emitting diode die, and a cap layer. Each outer electrode includes an end surface section and a side surface section. The end surface sections are disposed, corresponding to the inner electrodes, on the second surface. Each side surface section extends onto the side surface of the electrode portion. The conductive pillar penetrates between the inner electrode and the outer electrode. The light emitting diode die is on the first surface, electrically connecting the inner electrode. The cap layer covers the light emitting diode die.

8 Claims, 14 Drawing Sheets

LIGHT EMITTING DIODE PACKAGE AND METHOD OF FABRICATING THE SAME

BACKGROUND OF THE INVENTION

1. Field of the Invention

The present invention relates to a light emitting diode package and a method of fabricating the same.

2. Description of the Related Art

Modern portable devices such as notebooks, personal digital assistants, and mobile phones increasingly adopt backlight modules using light emitting diodes as light sources for illuminating their display components. With the current trend for compact design of portable devices, the size of the light emitting diodes used therein must be reduced correspondingly.

To meet the above-mentioned requirement, U.S. Patent No. 2006/0,284,207 discloses a light emitting diode (LED) package, which is comprises a substrate, inner electrodes formed on the substrate, an LED disposed on the substrate, and a cover material covering the LED and the substrate. The LED package further comprises vertical electrodes and outer electrodes on the back side of the LED package, wherein the vertical electrodes connect separately the inner electrodes and the outer electrodes, thereby establishing electrical connection between the inner electrodes and the outer electrodes. However, when the LED package is very small, the outer electrodes are not easily used as external connection points due to their small size, and testing of the LED package cannot easily be performed using the outer electrodes. In addition, the outer electrodes are on the back side of the LED package; thus, there are limitations on how the LED package can be installed.

Due to the imperfections of conventional small LED packages, a new small LED package without the above issues is required.

SUMMARY OF THE INVENTION

To solve the above issues, the present invention provides a light emitting diode package and a method of fabricating the same, which combines a through slot forming technique and a plate bonding technique such that the fabricated LED package can be assembled vertically or horizontally and tested easily.

One embodiment of the present invention provides a light emitting diode package comprising a base, an electrode portion, a pair of inner electrodes, a pair of outer electrodes, a pair of conductive pillars, a light emitting diode die, and a cap layer. The base has a first surface. The electrode portion attaches to the base, opposite to the first surface. The electrode portion includes a second surface opposite to the first surface and a side surface extending along the periphery of the second surface. The pair of inner electrodes are disposed on the first surface. Each outer electrode includes an end surface section and a side surface section extending from the end surface section. The end surface sections, corresponding to the pair of inner electrodes, are disposed on the second surface. The side surface sections extend onto the side surface. The conductive pillars penetrate between the inner electrodes and the outer electrodes. The light emitting diode die is disposed on the first surface, electrically connecting the inner electrodes. The cap layer covers the light emitting diode die.

The present invention provides a method for fabricating a light emitting diode package comprising the steps of: providing a first substrate having a first metal layer; forming a plurality of through slots on the first substrate to obtain a plurality of stripe structures; providing a second substrate having a second metal layer; attaching the first substrate to the second substrate with the first metal layer and the second metal layer being outside; etching the first metal layer and the second metal layer so that on a position of each stripe structure two first metal layer stripes and two second metal layer stripes corresponding to the two first metal layer stripes are formed; forming a plurality of conductive pillars to connect corresponding portions of the first metal layer and the second metal layer; electroplating the first metal layer stripes and the second metal layer stripes to obtain a plurality of corresponding outer electrode layers and inner electrode layers; electrically connecting, in accordance with positions of conductive pillars, a plurality of light emitting diode dies to the adjacent inner electrode layers along each stripe structure; forming a cap layer on the plurality of light emitting diode dies; forming a plurality of crisscrossing cuts on the cap layer along the through slots and between adjacent rows, in a direction transverse to the through slots, of the light emitting diode dies; introducing mold material to the plurality of crisscrossing cuts to obtain a grid structure; and cutting along grid members of the grid structure.

The above-mentioned photoelectric device further comprises a second packaging layer, which is disposed within the accommodation space and between the lens structure and the first packaging layer.

BRIEF DESCRIPTION OF THE DRAWINGS

The invention will be described according to the appended drawings in which.

DETAILED DESCRIPTION OF THE INVENTION

To better understand the above-described objectives, characteristics and advantages of the present invention, embodiments, with reference to the drawings, are provided for detailed explanations.

Figure 1:
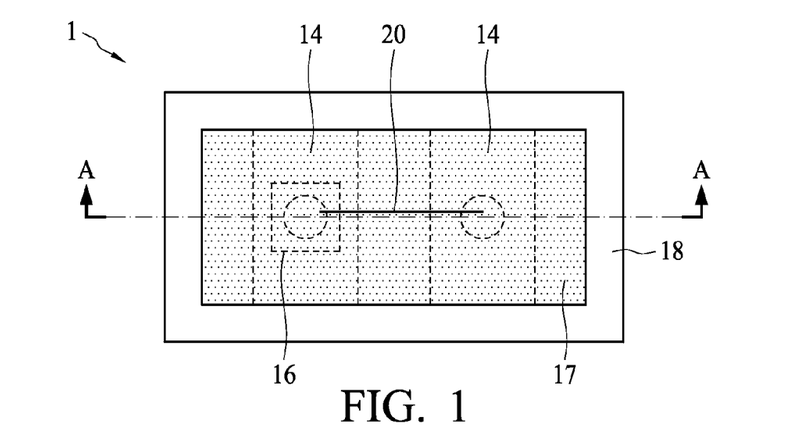
FIG. 1 is a top view showing a light emitting diode package according to one embodiment of the present invention.
Figure 2:
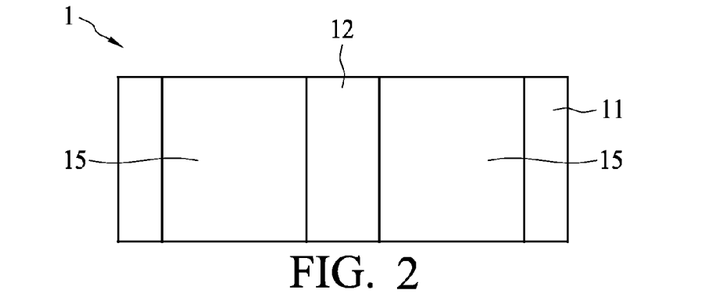
FIG. 2 is a bottom view showing a light emitting diode package according to one embodiment of the present invention.
Figure 3:
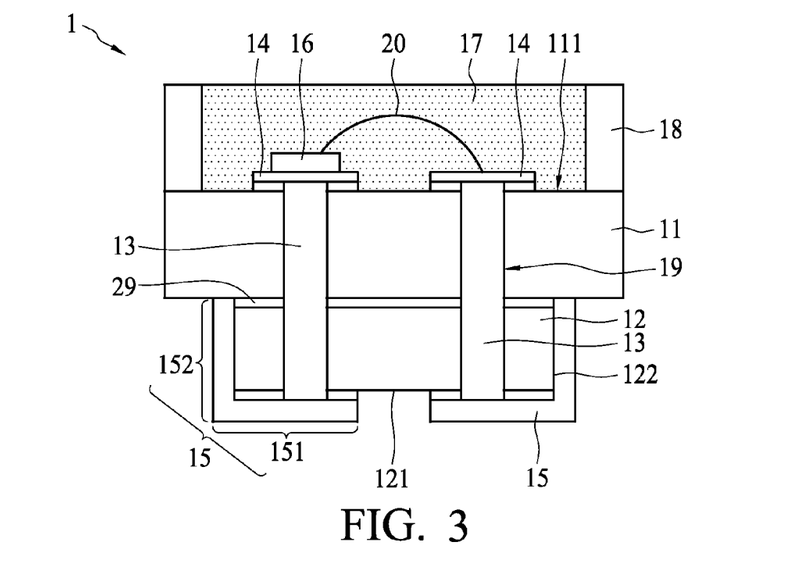
FIG. 3 is a cross-sectional view along line A-A of FIG. 1.

Referring to FIGS. 1 through 3, a light emitting diode (LED) package 1, provided in accordance with one embodiment of the present invention, includes a base 11, an electrode portion 12, a pair of conductive pillars 13, a pair of inner electrodes 14, a pair of outer electrodes 15, an LED die 16, a cap layer 17, and a reflective member 18. The base 11 has a first surface 111. The LED die 16 is disposed on the first surface 111. The electrode portion 12 is attached to the base 11, opposite to the first surface 111 as shown in FIG. 3.

Referring to FIG. 3, the electrode portion 12 has a second surface 121 facing opposite the first surface 111 and a side surface 122 extending along is the periphery of the second surface 121. A pair of through holes 19 penetrates through the base 11 and the electrode portion 12, between the first surface 111 and the second surface 121. A corresponding conductive pillar 13 is formed in each through hole 19. The pair of inner electrodes 14 is disposed on the first surface 111, corresponding to the through holes 19, and connecting the conductive pillars 13. Each outer electrode 15 comprises an end surface section 151 and a side surface section 152. Each end surface section 151 is disposed on the second surface 121, corresponding to a through hole 19, and connecting a corresponding conductive pillar 13. The side surface section 152 of each outer electrode 15 extends from the end surface section 151 onto the side surface 122 of the electrode portion 12. With the connection of the conductive pillars 13, the pair of inner electrodes 14 can separately and electrically connect the pair of outer electrodes 15.

Referring to FIG. 3 again, in one embodiment, the LED die 16 is disposed on one of the pair of inner electrodes 14, and electrically connects another of the pair of inner electrodes 14 with a conductive wire 20. The reflective member 18 is arranged on the first surface 111 of the base 11, surrounding the LED die 16, thereby reflecting light emitting laterally from the LED die 16 toward the opening of the reflective member 18 so as to increase the light extraction efficiency of the LED package 1 of the present invention. The cap layer 17 is filled in the reflective member 18, covering the LED 16 and the first surface 111.

In particular, in one embodiment, the base 11 can be cut from a printed circuit board or a ceramic substrate, and can have a rectangular shape. The electrode portion 12 can be cut from a printed circuit board or a ceramic substrate, and can also have a rectangular shape. The width of the electrode portion 12 can be substantially equivalent to that of the base 11, while the width of the electrode 12 can be smaller than that of the base 11. The base 11 and the electrode portion 12 can be secured using adhesive material 29. The inner electrode 14 and outer electrode 15 may comprise nickel gold alloy or nickel silver alloy. The conductive pillar 13 for electrically connecting the inner electrode 14 and the outer electrode 15 may be conductive resin, which may comprise epoxy and silver powder mixed therein. The outer electrodes 15 may be separately formed on an end of the conductive pillars 13, and extend onto the surfaces, perpendicular to the longitudinal direction of the electrode portion 12, of two end portions. Thus, the outer electrode 15 has a configuration similar to an L-shaped band. The cap layer 17 may be a phosphor layer, which absorbs a portion of light from the LED die 16 and produces complementary light. The reflective member 18 can be made of reflective material including titanium dioxide.

Figure 4:
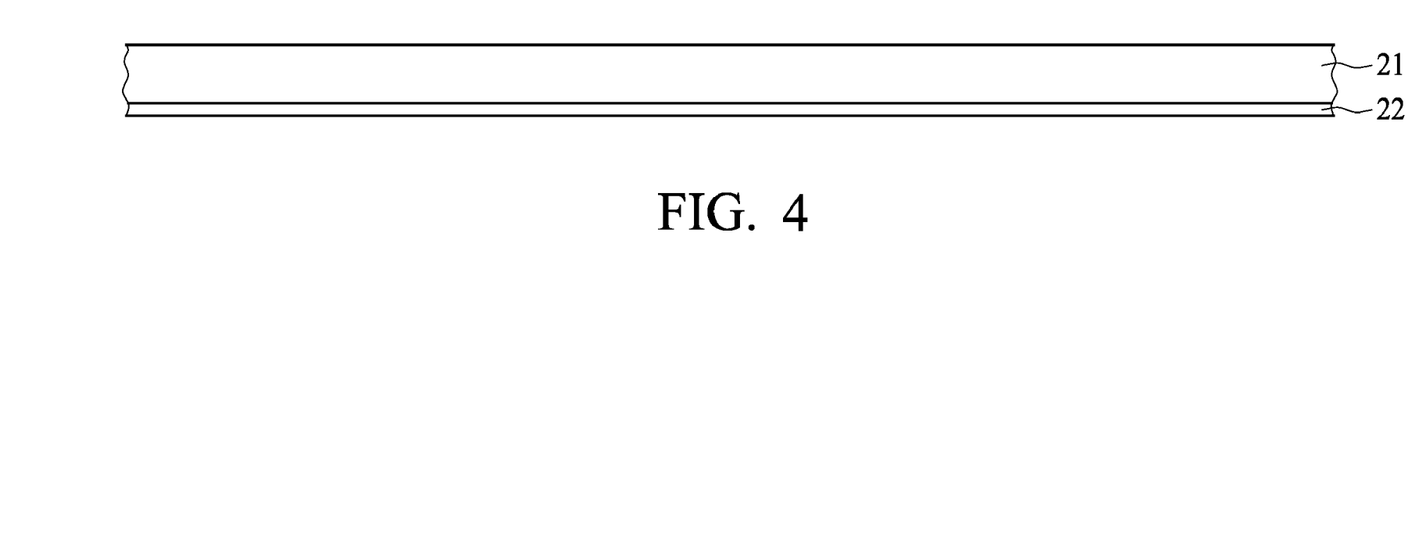
FIGS. 4 through 15 are cross-sectional views of structures formed in process steps related to a method of fabricating a light emitting diode package according to one embodiment of the present invention.

FIGS. 4 through 15 are cross-sectional views of structures formed in process steps related to a method of fabricating a light emitting diode package according to one embodiment of the present invention. As shown in FIG. 4, the method of the embodiment initially provides a first substrate 21, which can be a printed circuit board or a ceramic substrate. A first metal layer 22 is formed on a surface of the first substrate 21, wherein the first metal layer 22 can be a copper film.

Figure 5A:
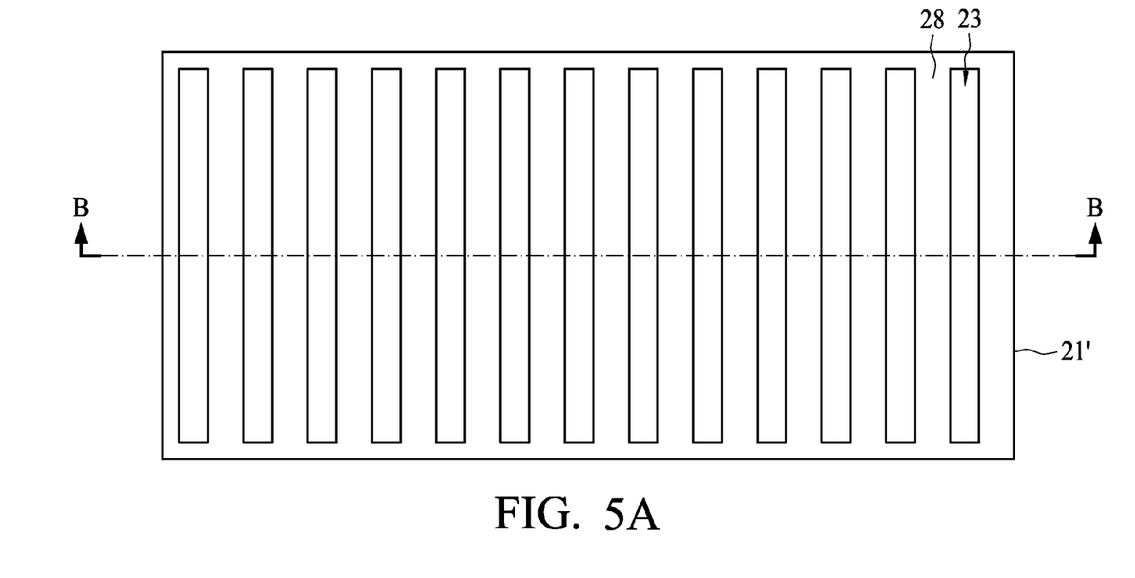
Figure 5B:
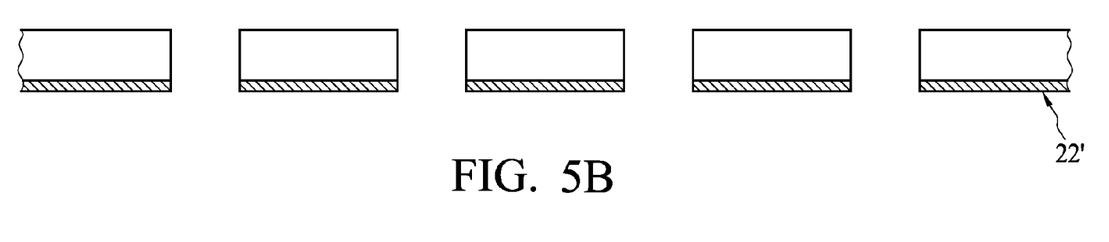

FIG. 5A is a top view showing a first substrate 21' according to one embodiment of the present invention, and FIG. 5B is a cross-sectional view along line B-B of FIG. 5A. A through slot forming technique is applied to form a plurality of through slots 23 spaced apart from each other in a predetermined direction on the first substrate 21'. In other words, the plurality of through slots 23 divide the first substrate 21' into a plurality of stripe structures 28, wherein each stripe structure 28 extends transverse to the predetermined direction. The through slots 23 are through the first metal layer 22 so as to form a new first metal layer 22' with a plurality of stripe-like hollow-outs.

Figure 6:
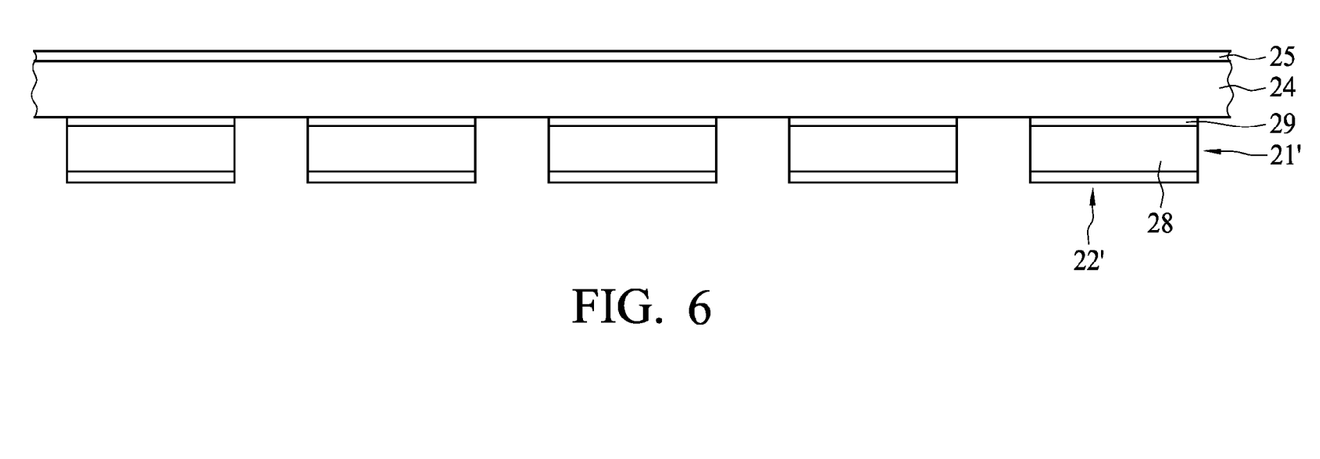

Referring to FIG. 6, a second substrate 24 is provided, on which a second metal layer 25 is formed, wherein the second metal layer 25 can be a copper film. Next, adhesive material 29 is used to bond the first substrate 21' to the second substrate 24, wherein the first metal layer 22' and the second metal layer 25 are separately disposed on opposite external sides.

Figure 7:
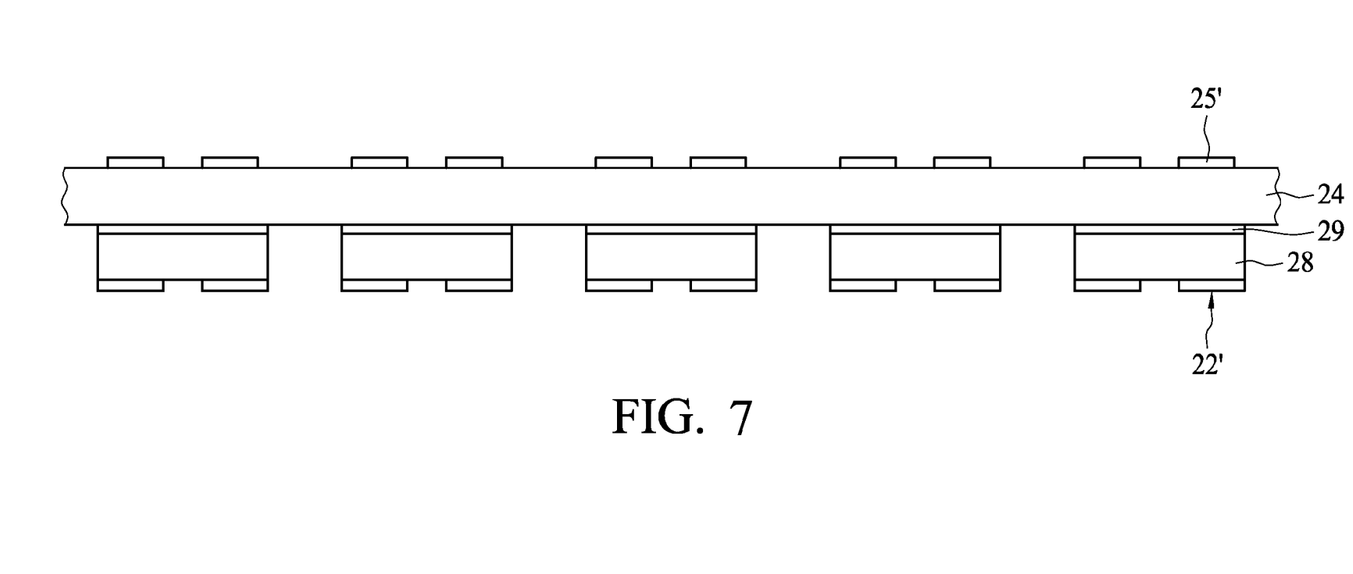

Referring to FIG. 7, using an etch process, the first metal layer 22' and the second metal layer 25 are respectively etched out a plurality of independent first metal layer stripes 22" and a plurality of independent second metal layer stripes 25' corresponding in position to the plurality of independent first metal layer stripes 22".

Figure 8:
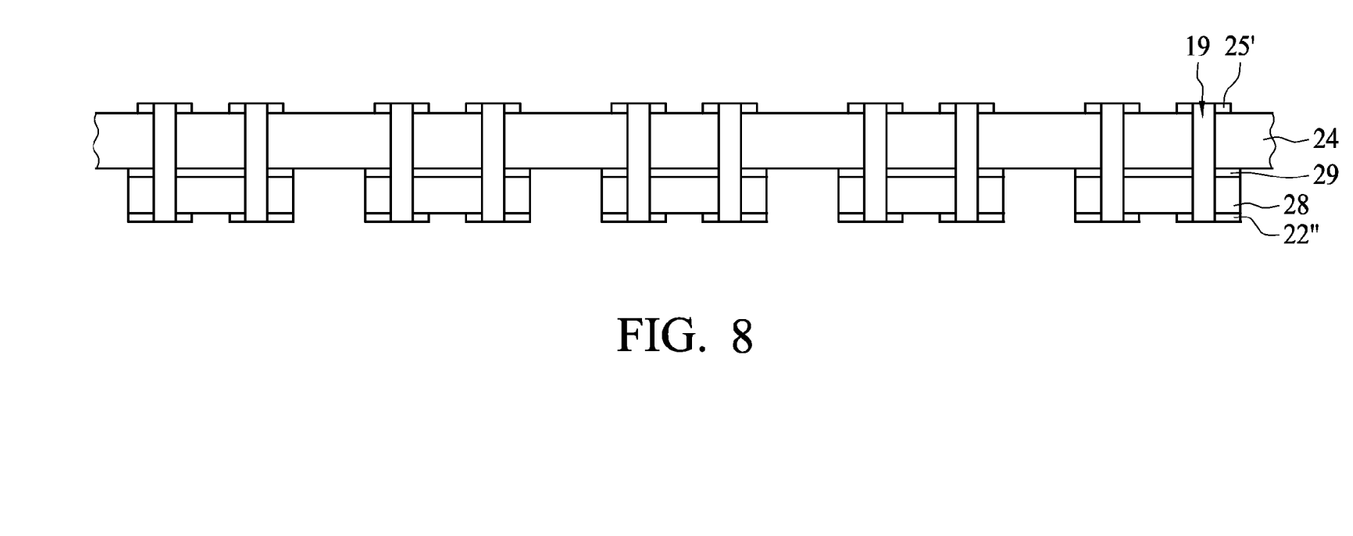

Referring to FIG. 8, by a method using a mechanical drill or a laser, a plurality of paired through holes 19 is formed on two second metal layers 25', along the longitudinal direction (perpendicular to the paper of this specification) of each stripe structure 28. Specifically, the through holes 19 can be aligned in a direction transverse to the stripe structures 28. The paired through holes 19 can be equally spaced in a direction parallel to the longitudinal direction of the stripe structure 28.

Figure 9:
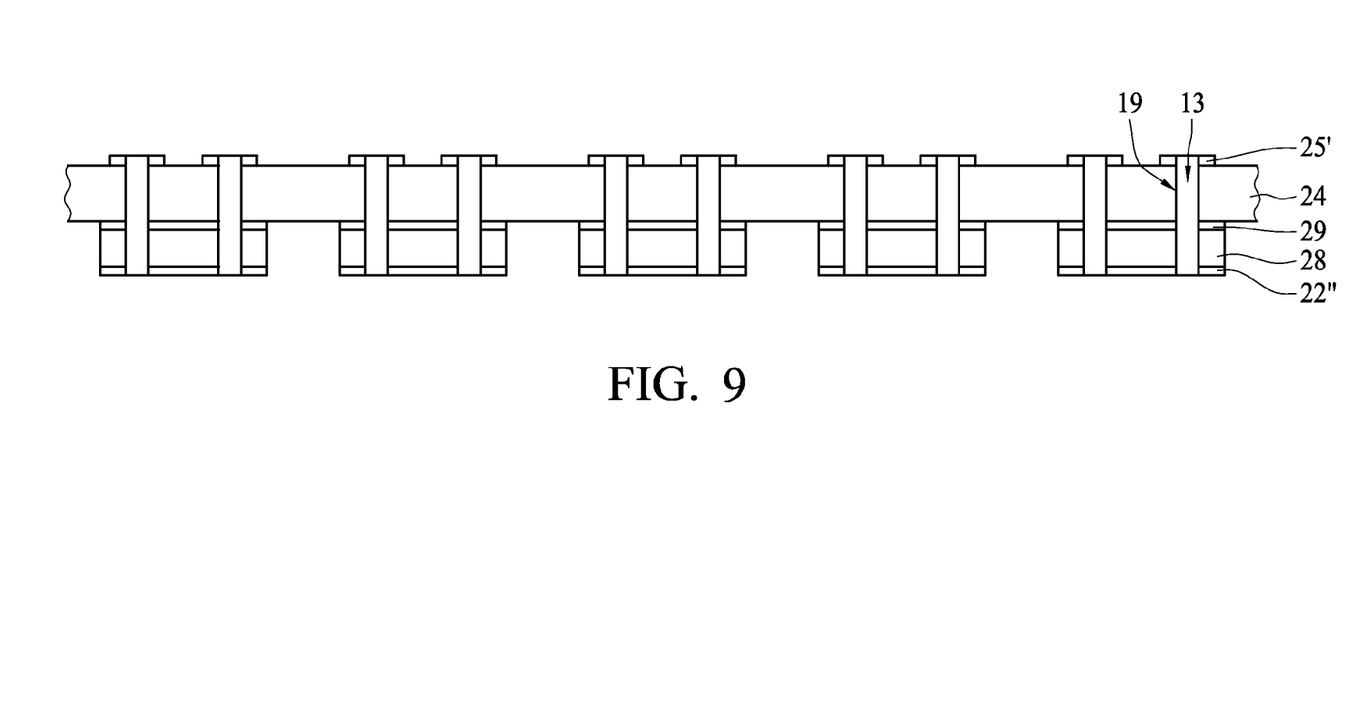

Referring to FIG. 9, conductive resin is filled in each through hole 19. After the conductive resin is cured, a plurality of conductive pillars 13 are formed. The conductive resin may comprise epoxy and silver powder mixed therein.

Figure 10:
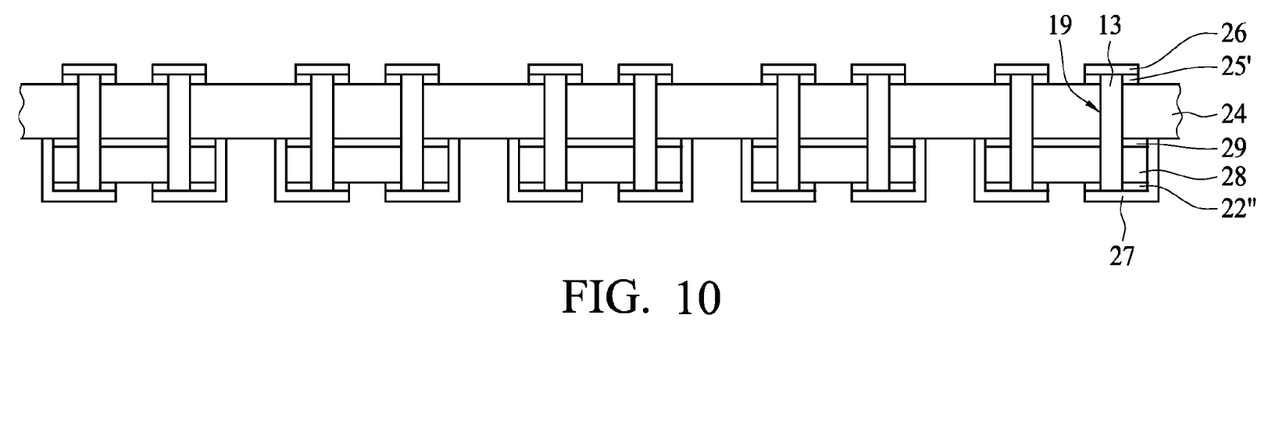

Referring to FIG. 10, an electroplating technique is performed to electroplate the surfaces of the first metal layer 22" and the second metal layer 25'. The electroplating process produces a corresponding striped outer electrode layer 27. Because metal layers are simultaneously formed on the side surface of each stripe structure 28, each outer electrode layer 27 thus has an L-shaped configuration. Simultaneously, the electroplating process produces a plurality of inner electrode layers 26 on the second metal layer 25', wherein the inner electrode layers 26 and the outer electrode layer 27 may comprise nickel gold alloy or nickel silver alloy.

Figure 11:
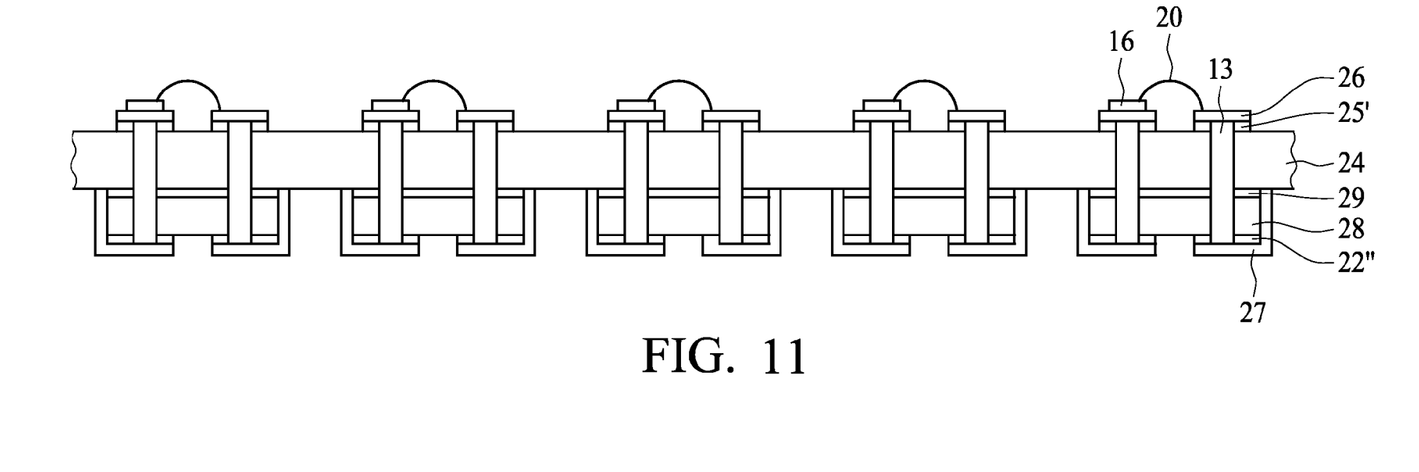

Referring to FIG. 11, the plurality of LED dies 16 are disposed on the inner electrode layers 26, arranged in such a manner that the plurality of LED dies 16 are along and transverse to the stripe structures 28. Each LED is die 16 is on the connection between the inner electrode layer 26 and the conductive pillar 13, and at least one conductive wire 20, wired transverse to the stripe structure 28, is used to electrically form the connection between another inner electrode layer 26 and another conductive pillar 13 on the same stripe structure 20. In other words, each LED die 16 is on one of the paired conductive pillars 13 and electrically connects to the inner electrode layer 26, and simultaneously electrically connects to the inner electrode layer 26 on another conductive pillar 13 in the same pair.

Figure 12:
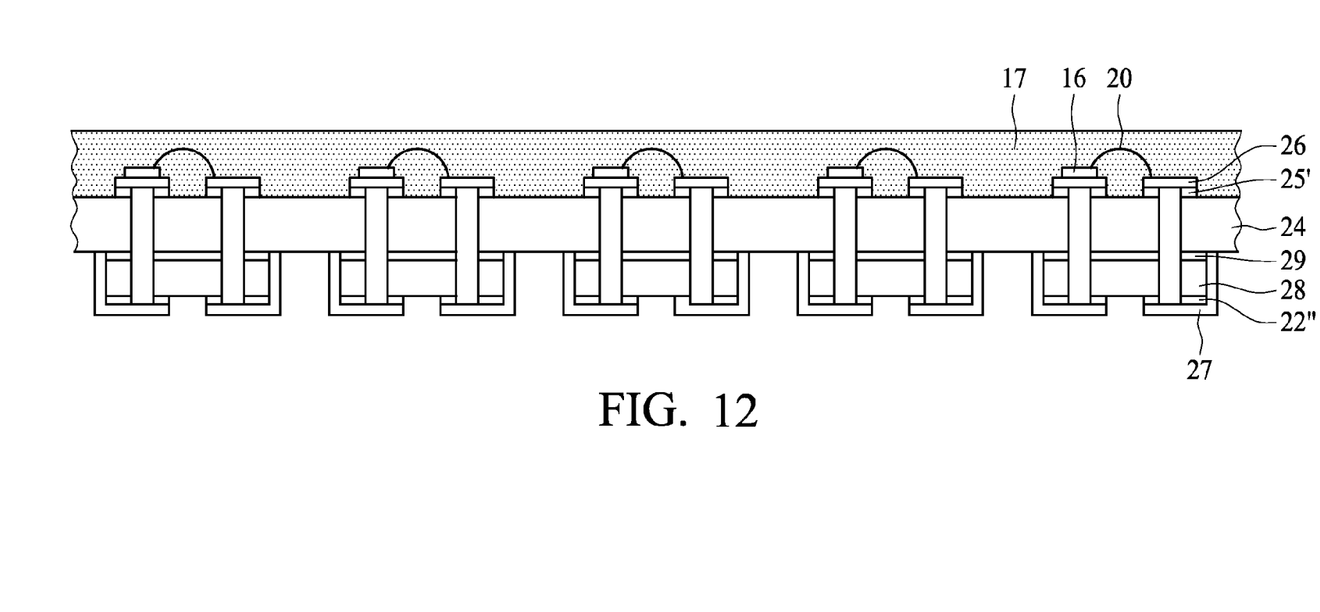

Referring to FIG. 12, the cap layer 17 is formed on the second substrate 24 using a transfer molding or an injection molding technique, covering the LED dies 16 and the inner electrode layers 26. The cap layer 17 can be a transparent resin including phosphor powder, for example, a mixture of epoxy and phosphor powder.

Figure 13:
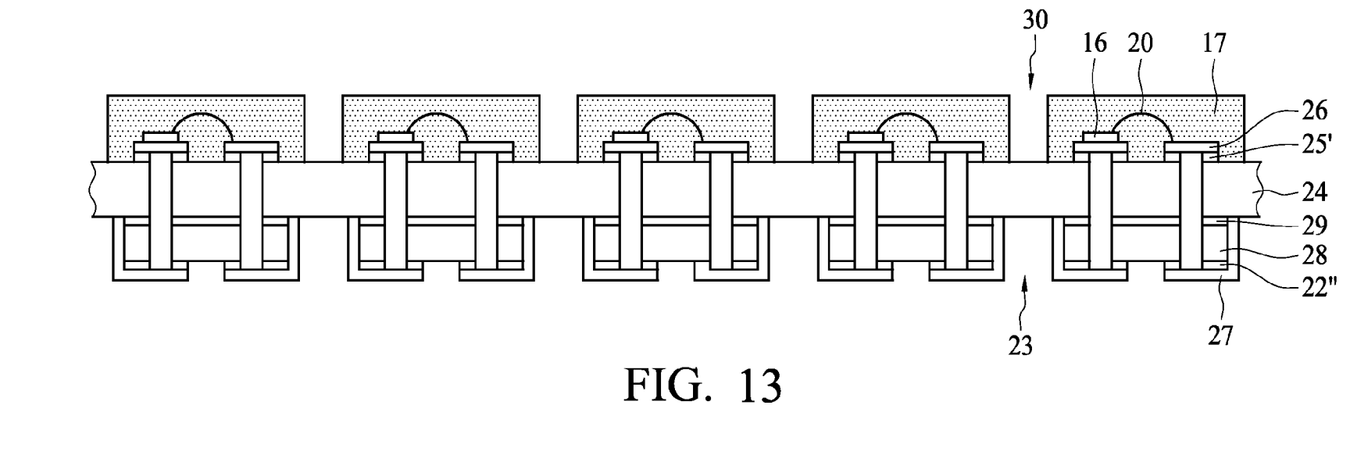
Figure 14:
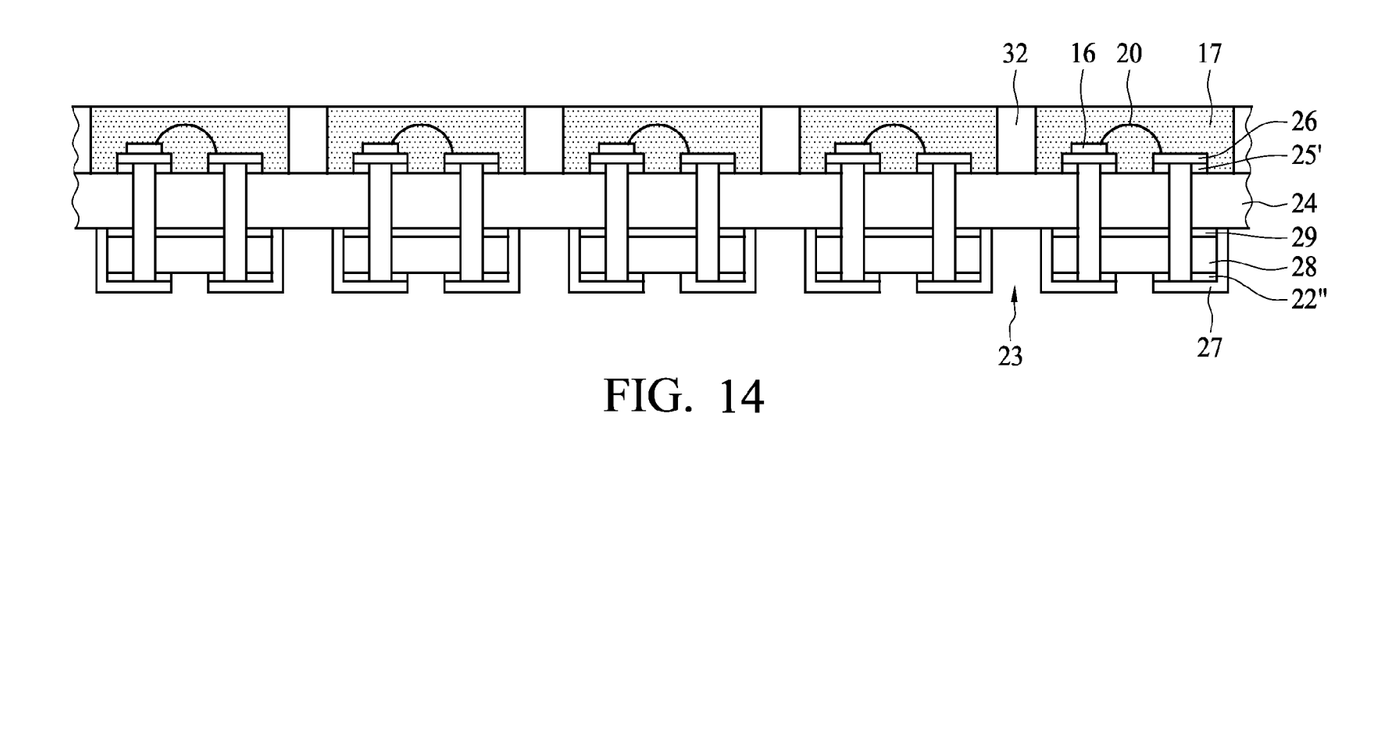

Referring to FIG. 13, a plurality of crisscrossing cuts 30 are formed on the cap layer 17, above the through slots 23 between the stripe structures 28 and between the rows, in a direction transverse to the through slot 23, of LED dies 16. Referring to FIG. 14, molten reflective material is introduced to the plurality of cuts 30 as shown in FIG. 13 using a transfer molding or injection molding technique. After the mold material is cured, a grid structure 32 is obtained. The height of the grid structure 32 can be substantially equivalent to that of the cap layer 17. The material of the grid structure 32 can be material with high reflectance such as titanium dioxide.

Figure 15:
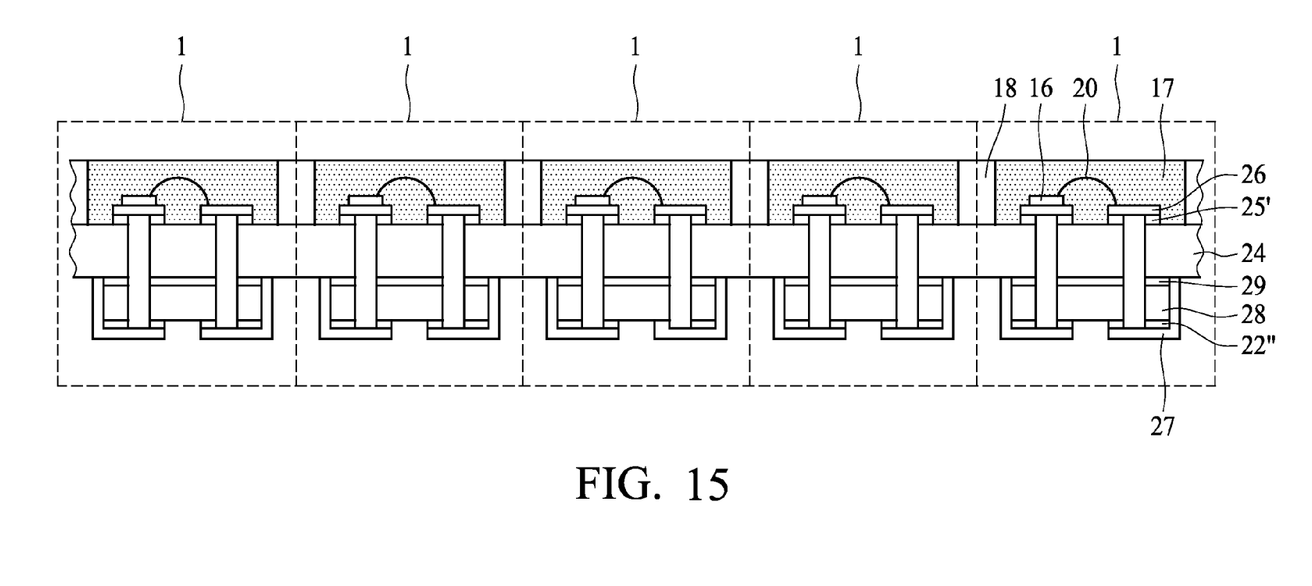

Referring to FIG. 15, the grid structure 32 and the second substrate 24 below the grid structure 32 are cut off at the middle of the grid members of the grid structures and along the extension direction of the grid members of the grid structure 32 so as to obtain a plurality of independent LED packages 1 with reflective members 18.

Figure 16:
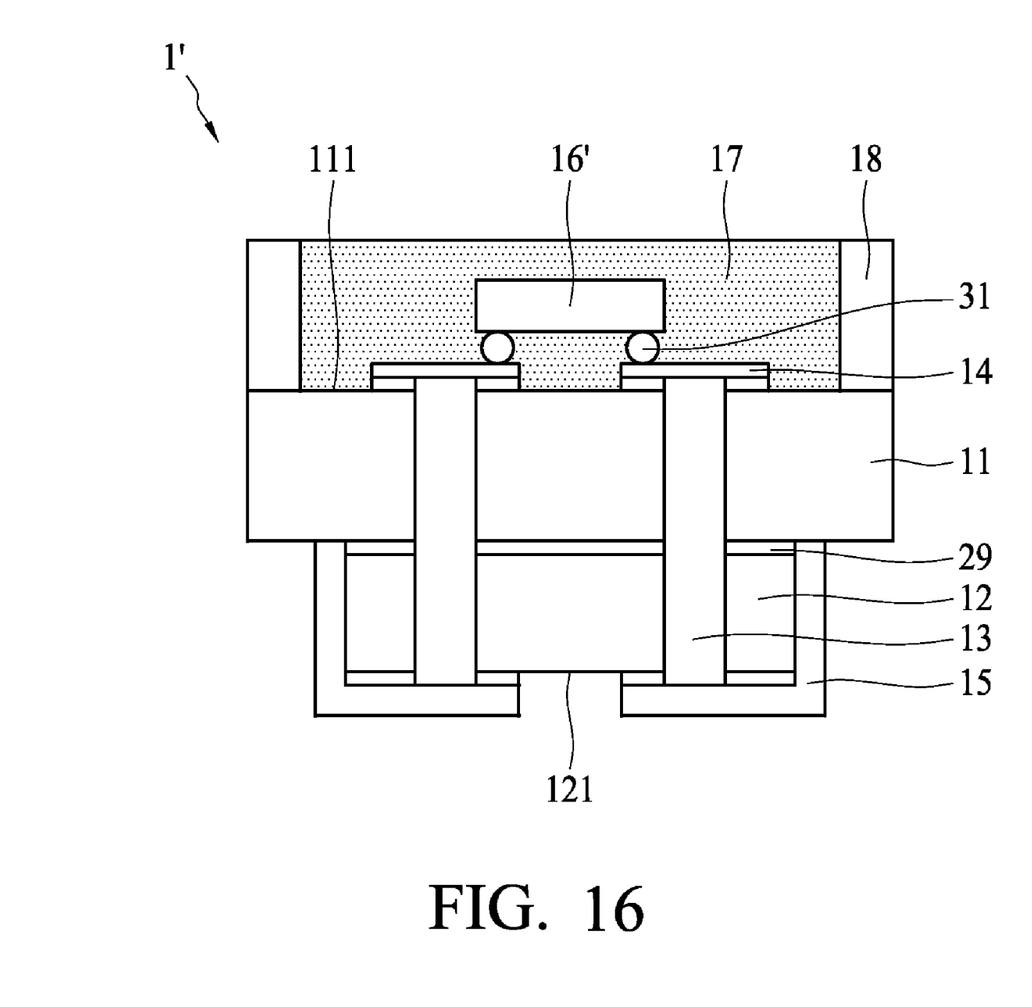
FIG. 16 is a cross-sectional view showing a light emitting diode package according to another embodiment of the present invention.

Referring to FIG. 16, another embodiment of the present invention discloses an LED package 1' including a base 11, an electrode portion 12, a pair of conductive pillars 13, a pair of inner electrodes 14, a pair of outer electrodes 15, an LED die 16, a cap layer 17, and a reflective member 18. The electrode portion 12 is connected to the base 11, disposed opposite to the first surface 111. The conductive pillars 13 penetrate through the first surface 111 and the second surface 121. The inner electrode 14 and the outer electrode 15 are separately formed on two ends of a corresponding conductive pillar 13 such that the inner electrode 14 and the outer electrode 15 can be electrically connected.

The LED die 16' is flip-chipped, electrically connected to the inner electrodes 14 using bumps 31. The reflective member 18 is disposed on the first surface of the base 11, surrounding the LED die 16', thereby reflecting light laterally emitted from the LED die 16 toward the opening of the reflective member 18. The cap layer 17 is filled in the reflective member 18, covering the LED die 16 and the first surface 111.

In summary, compared to conventional packaging methods for a light emitting diode, the method of an LED package of the present invention combines a through slot forming technique and a plate bonding technique such that the LED package can be assembled vertically or horizontally. Further, external electrodes extend onto lateral sides so that the LED package can be easily tested.

The above-described embodiments of the present invention are intended to be illustrative only. Numerous alternative embodiments may be devised by persons skilled in the art without departing from the scope of the following claims.

What is claimed is:

1. A light emitting diode package, comprising:
a base including a first surface;
an electrode portion attaching to the base by an adhesive material on a surface of the base which is opposite to the first surface, the electrode portion including a second surface opposite to the first surface and a side surface extending along the periphery of the second surface;
a pair of inner electrodes disposed on the first surface;
a pair of outer electrodes each including an end surface section disposed on the second surface and a side surface section, the end surface sections corresponding to the pair of inner electrodes, and the side surface sections extending onto the side surface;
a pair of conductive pillars disposed respectively between the inner electrodes and the outer electrodes, each of the pair of the conductive pillars embedded through both of the base and the electrode portion to connect a corresponding inner electrode to a corresponding outer electrode;
a light emitting diode die disposed on at least one of the pair of inner electrodes, electrically coupling the inner electrodes; and
a cap layer covering the light emitting diode die.

2. The light emitting diode package of claim 1, further comprising a reflective member disposed on the first surface, surrounding the light emitting diode die.

3. The light emitting diode package of claim 2, wherein the reflective member comprises titanium dioxide.

4. The light emitting diode package of claim 1, wherein the base and the electrode portion comprise a printed circuit board or ceramic substrate.

5. The light emitting diode package of claim 1, wherein the inner electrode and the outer electrode comprise nickel gold alloy or nickel silver alloy.

6. The light emitting diode package of claim 1, wherein the conductive pillar comprises epoxy and silver powder.

7. The light emitting diode package of claim 1, further comprising a conductive wire, wherein the light emitting diode die is on one of the pair of inner electrodes and wired to another one of the pair of inner electrodes with the conductive wire.

8. The light omitting diode package of claim 1, wherein the light emitting diode die is flip-chipped onto the pair of inner electrodes.

* * * * *